(12) United States Patent
Tanaka

(10) Patent No.: US 10,365,772 B2
(45) Date of Patent: Jul. 30, 2019

(54) TOUCH DETECTION APPARATUS AND VEHICLE NAVIGATION APPARATUS

(71) Applicant: DENSO CORPORATION, Kariya, Aichi-pref. (JP)

(72) Inventor: Hidetaka Tanaka, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 183 days.

(21) Appl. No.: 14/916,199

(22) PCT Filed: Sep. 1, 2014

(86) PCT No.: PCT/JP2014/004461
§ 371 (c)(1),
(2) Date: Mar. 3, 2016

(87) PCT Pub. No.: WO2015/033544
PCT Pub. Date: Mar. 12, 2015

(65) Prior Publication Data
US 2016/0216803 A1   Jul. 28, 2016

(30) Foreign Application Priority Data
Sep. 5, 2013 (JP) .................... 2013-183979

(51) Int. Cl.
*G06F 3/02* (2006.01)
*B60K 35/00* (2006.01)
(Continued)

(52) U.S. Cl.
CPC .............. *G06F 3/044* (2013.01); *B60K 35/00* (2013.01); *B60K 37/06* (2013.01); *G06F 3/02* (2013.01);
(Continued)

(58) Field of Classification Search
None
See application file for complete search history.

(56) References Cited

U.S. PATENT DOCUMENTS 6,424,338 B1 * 7/2002 Anderson ............. G06F 3/0213
345/174
2007/0181410 A1 * 8/2007 Baier ..................... F24C 7/082
200/17 R
(Continued)

FOREIGN PATENT DOCUMENTS

JP  2008143198 A  6/2008
JP  2009213126 A  9/2009
(Continued)

OTHER PUBLICATIONS

International Search Report and Written Opinion (in Japanese with English Translation) for PCT/JP2014/004461, dated Oct. 7, 2014; ISA/JP.

*Primary Examiner* — Matthew Yeung
(74) *Attorney, Agent, or Firm* — Harness, Dickey & Pierce, P.L.C.

(57) ABSTRACT

A touch detection apparatus that detects a touch to a capacitive touch sensor is provided. The touch detection apparatus includes: a capacitive dummy sensor that is disposed to an operation portion; a capacitance detector that detects values of capacitances of the touch sensor and the dummy sensor; and a touch determination portion that determines whether the touch sensor is touched and that disables determination. Multiple dummy sensors are disposed corresponding to multiple touch sensors. The touch determination portion disables the determination of whether the touch sensor disposed in a vicinity of the one of the dummy sensors is touched.

12 Claims, 7 Drawing Sheets

(51) Int. Cl.
    *B60K 37/06*     (2006.01)
    *G06F 3/041*     (2006.01)
    *G06F 3/044*     (2006.01)
    *H03K 17/96*     (2006.01)
    *G06F 3/0362*     (2013.01)

(52) U.S. Cl.
    CPC .......... *G06F 3/0362* (2013.01); *G06F 3/0418* (2013.01); *H03K 17/9622* (2013.01); *B60K 2350/1036* (2013.01); *H03K 2217/94026* (2013.01); *H03K 2217/960705* (2013.01)

(56) References Cited

U.S. PATENT DOCUMENTS

| | | | |
|---|---|---|---|
| 2008/0088582 A1* | 4/2008 | Prest | G06F 3/0338 345/156 |
| 2008/0140282 A1 | 6/2008 | Ando | |
| 2008/0192024 A1* | 8/2008 | Mita | G06F 3/044 345/173 |
| 2009/0101417 A1* | 4/2009 | Suzuki | G06F 3/0418 178/18.06 |
| 2010/0171646 A1 | 7/2010 | Yano et al. | |
| 2014/0192014 A1* | 7/2014 | Lee | G06F 3/0416 345/174 |
| 2014/0267688 A1* | 9/2014 | Aich | H04N 7/181 348/113 |
| 2015/0242028 A1* | 8/2015 | Roberts | G06F 3/044 345/173 |

FOREIGN PATENT DOCUMENTS

| | | |
|---|---|---|
| JP | 2010020674 A | 1/2010 |
| JP | 2010141834 A | 6/2010 |
| JP | 2012243566 A | 12/2012 |
| JP | 2012247839 A | 12/2012 |

\* cited by examiner

TOUCH DETECTION APPARATUS AND VEHICLE NAVIGATION APPARATUS

CROSS-REFERENCE TO RELATED APPLICATIONS

This application is a U.S. National Phase Application under 35 U.S.C. 371 of International Application No. PCT/JP2014/004461 filed on Sep. 1, 2014 and published in Japanese as WO 2015/033544 A1 on Mar. 12, 2015. This application is based on and claims the benefit of priority from Japanese Patent Application No. 2013-183979 filed on Sep. 5, 2013. The entire disclosures of all of the above applications are incorporated herein by reference.

TECHNICAL FIELD

The present disclosure relates to a touch detection apparatus that detects a touch to a capacitive touch sensor, and a vehicle navigation apparatus having the touch detection apparatus.

BACKGROUND ART

As an operation switch for various devices, there is a touch switch using a capacitive touch sensor. A touch (for example, a touch of a human body such as a human finger) for the touch switch is detected as follows. A capacitance value at the time when the human body (for example, a finger) does not touch an electrode of the touch sensor is set as a reference value, and it is determined whether there is a touch based on a result (that is, a change in capacitance value) of comparing the reference value with a detected value of a capacitance of the touch sensor.

The capacitive touch sensor may cause unintended operation, that is, malfunction due to an influence of external radio noise. In order to prevent the malfunction, an immunity measure to eliminate the influence of noise as much as possible has been variously proposed. For example, Patent document 1 discloses a technique for detecting environmental radio noise with the use of a dummy electrode (a dummy sensor) to prevent erroneous determination on a touch electrode (a touch sensor). In this technique, the dummy sensor is disposed at a distance apart from the touch sensor so as not to affect the touch operation on the touch sensor. When the touch operation (a change in the capacitance value) on the dummy sensor is detected, a determination that operation on the touch sensor is present may be discarded.

The inventor of the present application has found the following regarding the touch detection apparatus and the vehicle navigation apparatus.

The touch sensor may malfunction due to not only an influence of the external radio noise but also a user's unintentional touch. Such malfunction may easily occur in a layout where another operating unit (for example, a push switch, an operation knob) is disposed at a position extremely close to a switch using the touch sensor. In this layout, when the user attempts to operate the operation portion located in the vicinity of the touch sensor, the user's finger may unintentionally touch the touch switch. In this case, unintentional erroneous operation may be performed. The malfunction caused by the user's unintentional touch cannot be prevented by the immunity measure.

PRIOR ART DOCUMENT

Patent Document

Patent document 1: JP 2010-20674 A

SUMMARY OF INVENTION

It is an object of the present disclosure to provide a touch detection apparatus that is capable of preventing malfunction caused by a user's unintentional touch and malfunction caused by external radio noise and a vehicle navigation apparatus having the touch detection apparatus.

According to one aspect of the present disclosure, a touch detection apparatus that detects a touch to a capacitive touch sensor operated by user's touch is provided. The touch detection apparatus includes: a capacitive dummy sensor that is disposed to an operation portion disposed in a vicinity of the touch sensor, the operation portion being operated by a user; a capacitance detector that detects values of capacitances of the touch sensor and the dummy sensor; and a touch determination portion that determines whether the touch sensor is touched, based on detection values of the capacitance detector. The touch determination portion disables determination of whether the touch sensor is touched when a variation in capacitance of the dummy sensor exceeds a predetermined determination value.

According to another aspect of the present disclosure, a vehicle navigation apparatus including a switch using a capacitive touch sensor and the touch detection apparatus is provided. The operation portion to which the dummy sensor is disposed is provided by an operation knob that is disposed in a vicinity of the switch and operated by a user. Touch operation to the switch is detected by the touch detection apparatus.

According to the touch detection apparatus and the vehicle navigation apparatus of the present disclosure, when the user's finger touches (or comes close to) the operation portion for operating the operation portion, the capacitance of the dummy sensor is changed. When the variation in the capacitance of the dummy sensor exceeds a determination value, the touch determination portion disables the determination on the touch sensor by the touch determination portion. According to this configuration, the determination of whether the touch sensor is touched is not performed during the user operates the operation portion. Therefore, even when the user's finger erroneously touches the touch sensor, it may be possible to prevent the occurrence of malfunction.

According to the touch detection apparatus and the vehicle navigation apparatus of the present disclosure, it may be possible to prevent malfunction caused by the external radio noise from occurring as follows. When the external radio noise is generated, the capacitances of the touch sensor and the dummy sensor are changed in the similar manner. The touch determination portion disables the determination of whether the touch sensor is touched, when the variation in the capacitance of the dummy sensor exceeds the determination value. According to configuration, when the external radio noise is generated around, the determination of whether the touch sensor is touched is not performed. Therefore, even when the capacitance of the touch sensor is changed by the external radio noise, it may be possible to prevent the occurrence of malfunction.

According to the present disclosure, it may be possible to prevent both of the malfunction caused by the user's unintentional touch and the malfunction caused by the external radio noise.

BRIEF DESCRIPTION OF DRAWINGS

The above and other objects, features and advantages of the present disclosure will become more apparent from the following detailed description made with reference to the accompanying drawings. In the drawings.

PREFERRED EMBODIMENTS FOR CARRYING OUT INVENTION

Multiple embodiments of the present disclosure will be described with reference to the drawings. In the respective embodiments, substantially the same configurations are denoted by identical symbols, and repetitive description will be omitted.

First Embodiment

A first embodiment will be described with reference to FIG. 1 to FIG. 4.

Figure 1:
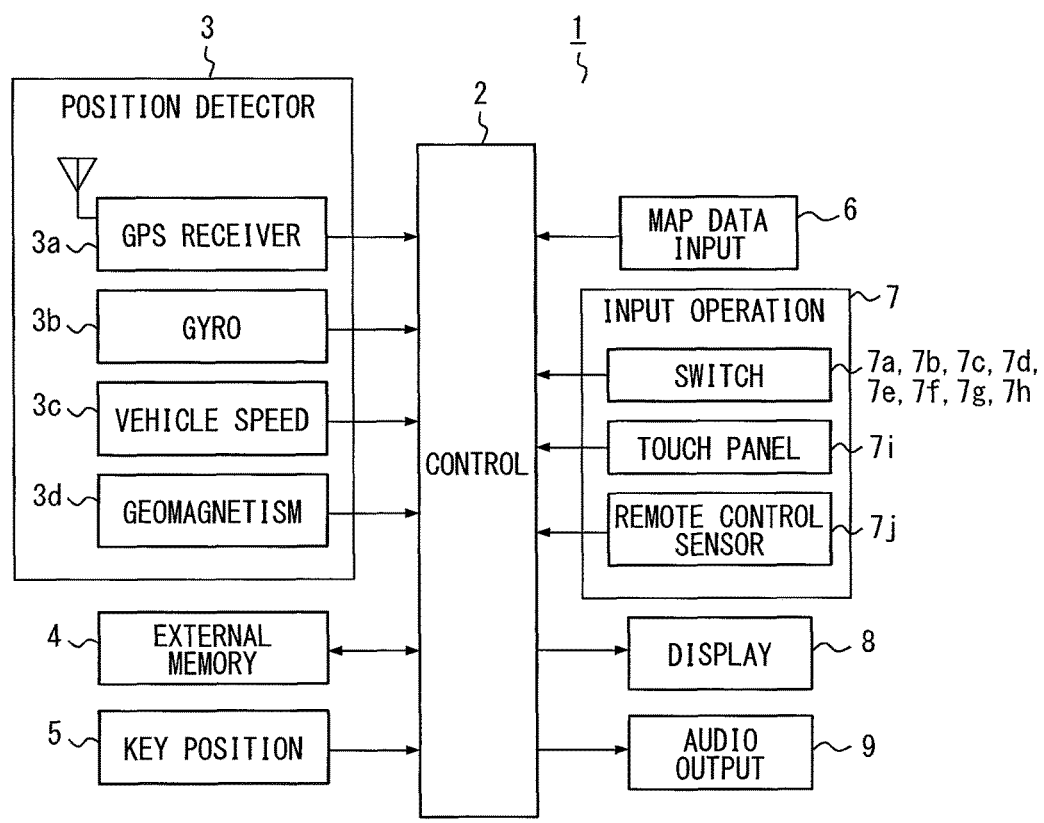
FIG. 1 is a block diagram illustrating a vehicle navigation apparatus according to a first embodiment.

As illustrated in FIG. 1, in a vehicle navigation apparatus 1, a control circuit 2 controls the overall operation of the apparatus is connected with a position detector 3, an external memory 4, a key position detector 5, a map data input device 6, an input operation portion 7, a display portion 8, and an audio output device 9.

The control circuit 2 is mainly configured by a microcomputer, and includes a CPU, a ROM, a RAM, a I/O, and a bus connecting those components to each other (all not shown). In those components, the ROM stores a control program for operating a vehicle navigation device, and the RAM temporarily stores processing data for execution of the program, and map data acquired from the map data input device 6.

The position detector 3 includes a GPS receiver 3a, a gyro scope 3b, a vehicle speed sensor 3c, and a geomagnetic sensor 3d. The GPS receiver 3a receives a GPS signal from a GPS (a global positioning system) satellite to detect a position of a vehicle. The gyro scope 3b detects a travel direction of the vehicle. The vehicle speed sensor 3c detects a speed in a front-back direction of the vehicle. The geomagnetic sensor 3d detects a travel orientation of the vehicle. Since each sensor has an error based on an inherent nature, the sensors are used with the interpolation of mutual output results. The position detector 3 may be configured by only a part of those components depending on a required precision. A rotation sensor for detecting a steering angle of a steering, and wheel sensors disposed in respective driven wheels may be added to the position detector 3.

The external memory 4 is configured by, for example, a flash memory card, and provided for storing or calling specific data such as registered point data, music data or video data. The key position detector 5 detects a key position of an ignition switch (not shown) of an automobile (a vehicle) in which the vehicle navigation apparatus 1 is mounted to detect an on/off state of an engine, that is, an on/off state of a power supply. The map data is input through the map data input device 6 for inputting various data including the map data. A storage medium of the map data input device 6 is generally exemplified by a CD-ROM, a DVD, or a hard disk based on the amount of data, but may be configured by another medium such as a memory card.

The display portion 8 includes, for example, a color liquid crystal display for displaying a map or characters, and is installed to the vicinity of a driver's seat of the vehicle. A marker indicative of a current position of the vehicle which is input by the position detector 3, the map data input through the map data input device 6, and additional data such as landmarks of a guidance route or a set point to be displayed on the map are displayed in a superimposed manner on a screen of the display portion 8. Furthermore, various input screens for searching and inputting a destination by the user as well as various messages or information are displayed on the screen of the display portion 8. The vehicle navigation apparatus 1 informs a driver of a travel guidance through the audio output device 9 by voice, and performs the travel guidance for the driver through both of the display by the display portion 8 and the audio output by the audio output device 9.

Figure 2A:
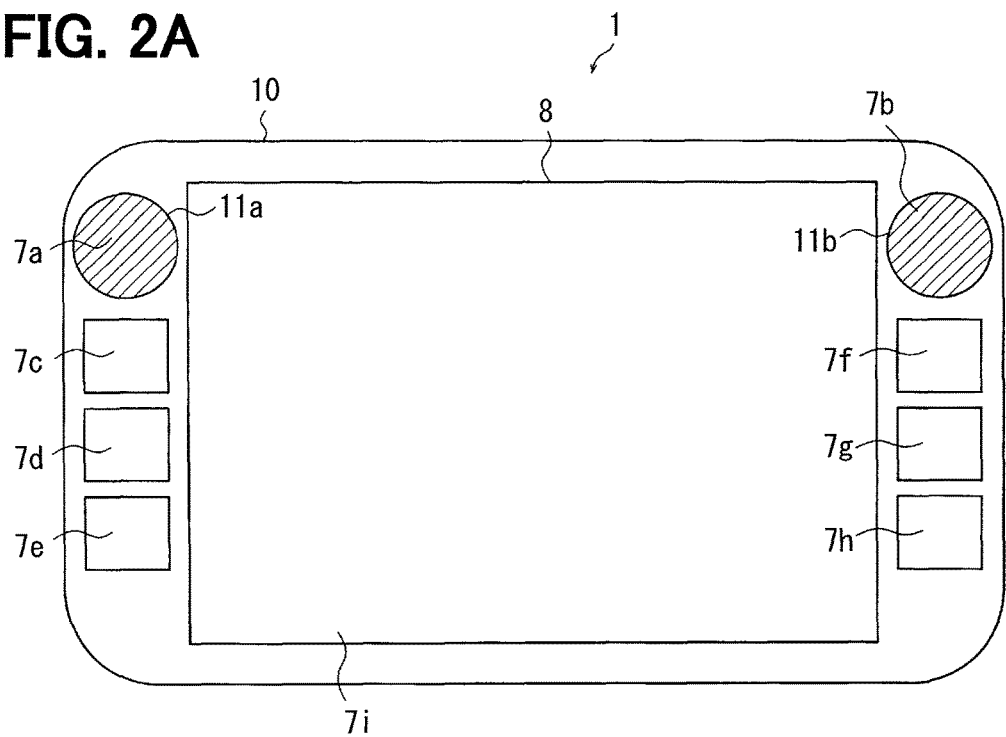
FIG. 2A is a front view of an appearance of mainly a display portion in the vehicle navigation apparatus.
Figure 2B:
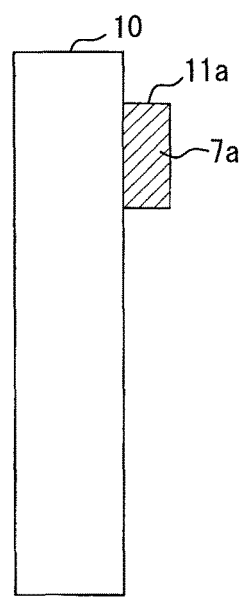
FIG. 2B is a side view of the appearance of mainly the display portion in the vehicle navigation apparatus.

As illustrated in FIGS. 1, 2A, and 2B, the input operation portion 7 is disposed integrally with the display portion 8, and includes, for example, a touch panel 7i using a resistance film system, and switches 7a to 7h arranged around (on the right and left of) the display portion 8 on a front surface part of a main body 10, which are used for various inputs. The switches 7a and 7b (corresponding to an operation portion) are mechanical switches (hard switches) which are operation knobs that enable both of rotating operation and depressing operation. The switches 7a and 7b are also referred to as "operation knobs 7a and 7b". The switches 7c to 7h are each a configuration using a capacitive touch sensor, that is, a touch switch.

The operation knobs 7a and 7b are provided with dummy sensors 11a and 11b, respectively. The dummy sensors 11a and 11b are formed of respective capacitive touch sensors. Although the detailed illustration is omitted, the dummy sensors 11a and 11b are arranged at places (hatched places in FIG. 2A and FIG. 2B) where the dummy sensors 11a and 11b can perform capacitive coupling with a user's finger when the user's finger touches the operation knobs 7a and 7b.

The dummy sensors 11a and 11b may be arranged at places where the dummy sensors 11a and 11b can perform the capacitive coupling with the user's finger when the user's finger comes closer to the operation knobs 7a and 7b when the dummy sensors 11a and 11b are positioned so as not to overlap with the switches 7c to 7h. The dummy sensors 11a and 11b are not intended to perform desired operation, but intended to prevent malfunction in the input operation portion 7.

The touch switches of this type may be disposed above and below the display portion 8. A remote controller (not illustrated) having the same functions as those of the operators 7a to 7i is also provided, and operation signals from the remote controller are supplied to the control circuit 2 through a remote control sensor 7j.

Figure 3:
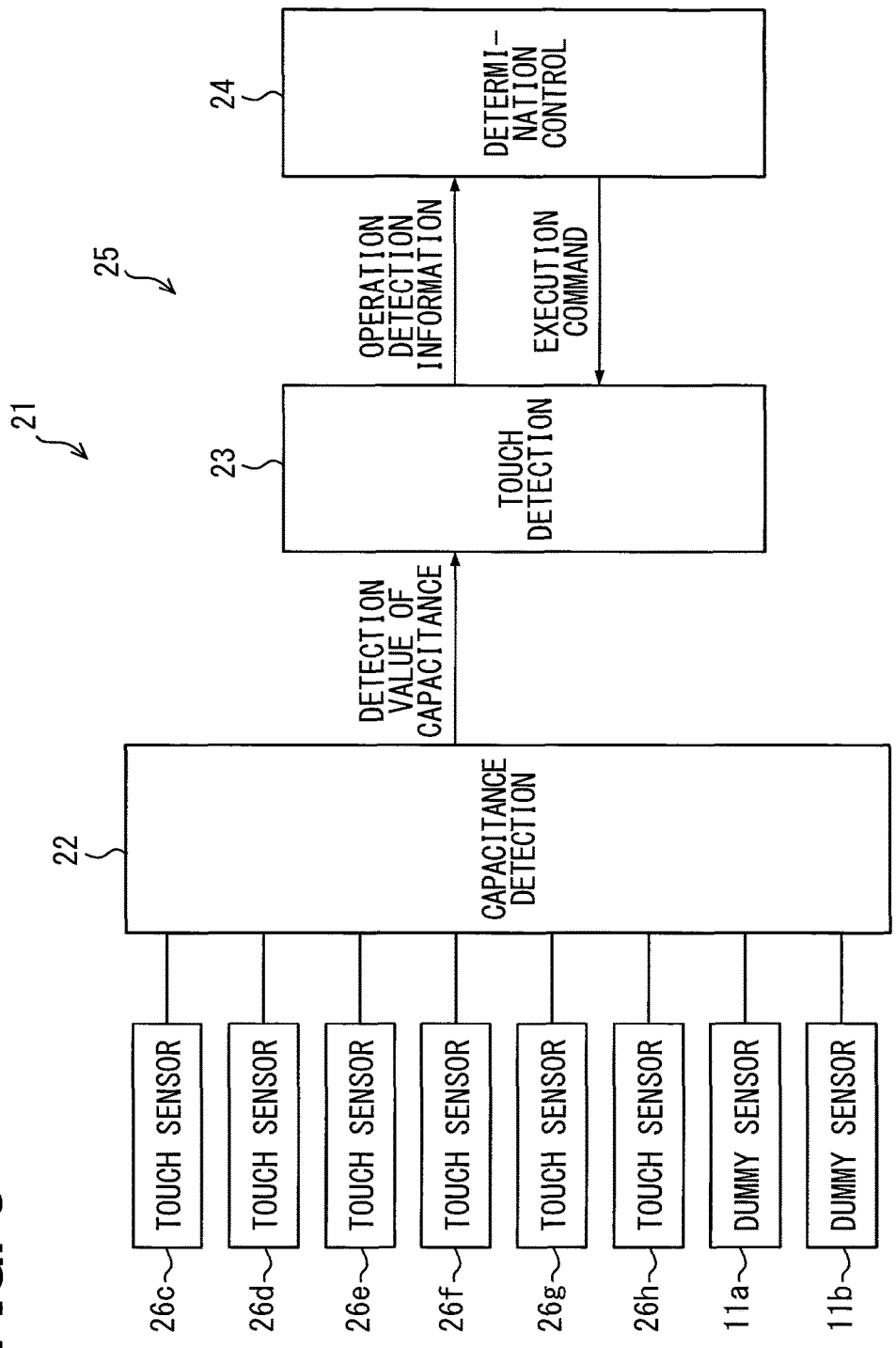
FIG. 3 is a block diagram illustrating a schematic configuration of a touch detection apparatus.

The touch operation on the switches 7c to 7h and the dummy sensors 11a, 11b, that is, a touch on the touch sensors is detected by a touch detection apparatus 21 illustrated in FIG. 3. In FIG. 1, the touch detection apparatus 21 is omitted from illustration. A detection result by the touch detection apparatus 21 is supplied to the control circuit 2. The touch detection apparatus 21 includes a capacitance detector 22 (corresponding to a capacitance detector), a touch detection portion 23, and a determination control portion 24. In the present embodiment, a touch determination portion 25 includes the touch detection portion 23 and the determination control portion 24.

The capacitance detector 22 detects values of capacitances of the touch sensors 26c to 26h corresponding to the respective switches 7c to 7h. The capacitance detector 22 also detects values of the capacitances of the dummy sensors 11a and 11b. The detection values of the capacitances of the touch sensors 26c to 26h and the dummy sensors 11a and 11b detected by the capacitance detector 22 are supplied to the touch detection portion 23.

The touch detection portion 23 determines whether the touch sensors 26c to 26h are touched (eventually, the touch operation of the switches 7c to 7h), based on the detection value of the capacitance supplied from the capacitance detector 22. The touch detection portion 23 determines whether the dummy sensors 11a and 11b are touched (eventually, the operation of the operation knobs 7a and 7b), based on the detection value of the capacitance supplied from the capacitance detector 22. In this case, when the variation in the capacitance of the touch sensors 26c to 26h or in the dummy sensors 11a, 11b exceeds a predetermined determination value, the touch detection portion 23 determines that the sensor is touched. When the touch detection portion 23 receives a command for execution of processing from the determination control portion 24, the touch detection portion 23 executes a process for determining whether the sensor is touched.

The touch detection portion 23 outputs information (operation detection information) on whether the touch sensors 26c to 26h and the dummy sensors 11a, 11b are touched to the determination control portion 24. The determination control portion 24 instructs the touch detection portion 23 to determine whether the sensor is touched for each predetermined cycle (for example, 1/1000 seconds). The determination control portion 24 finally determines whether the touch sensors 26c to 26h are touched, based on the operation detection information supplied from the touch detection portion 23. The results of the final determination by the determination control portion 24 are supplied to the control circuit 2 as the operation results of the touch sensors 26c to 26h, that is, the switches 7c to 7h.

Figure 4:
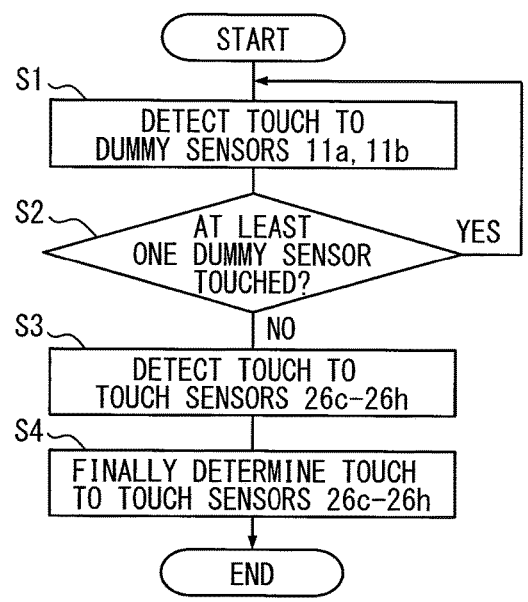
FIG. 4 is a flowchart illustrating the content of processing by the touch detection apparatus.

The operation of detecting that the touch sensors 26c to 26h are touched by the touch detection apparatus 21 will be described with reference to a flowchart of FIG. 4.

The determination control portion 24 commands the touch detection portion 23 to execute a process of determining whether the dummy sensors 11a and 11b are touched (Step S1). The determination control portion 24 determines whether the dummy sensors 11a and 11b are touched, based on operation detection information supplied from the touch detection portion 23 (Step S2).

When it is determined that at least one of the dummy sensors 11a and 11b is touched (YES in S2), the operation returns to Step S1. When it is determined that none of the dummy sensors 11a and 11b is touched (NO in S2), the operation proceeds to Step S3. In Step S3, the determination control portion 24 commands the touch detection portion 23 to execute a process of determining whether the touch sensors 26c to 26h are touched. The determination control portion 24 finally determines whether the touch sensors 26c to 26h are touched, based on the operation detection information supplied from the touch detection portion 23 (Step S4).

The determination control portion 24 determines whether the dummy sensors 11a and 11b are touched. When the determination control portion 24 determines that one or both of the dummy sensors 11a and 11b are touched, the determination control portion 24 does not determine (disables the determination of) whether the touch sensors 26c to 26h are touched. Thus, when the operation knob 7a that is close to the switch 7c or the operation knob 7b that is close to the switch 7f is operated, it may be possible to prevent the malfunction caused by the user's unintentional touch from occurring as follows.

In other words, when the user's finger touches (comes close to) the operation knob 7a or 7b for operating the operation knob 7a or 7b, the capacitance of the dummy sensor 11a or 11b is changed. The determination of whether the touch sensors 26c to 26h are touched is not performed when the variations in the capacitances of the dummy sensors 11a and 11b exceed the determination value. Therefore, the determination of the operation of the switches 7c and 7f is not performed while the user operates the operation knob 7a or 7b. Therefore, even when the user's finger erroneously touches the switch 7c or 7f when the operation knob 7a or 7b operates, the unintentional malfunction does not occur.

According to the above configuration, it may be possible to prevent malfunction caused by the external radio noise from occurring as follows. When the external radio noise generates, the capacitances of the touch sensors 26c to 26h and the dummy sensors 11a, 11b are changed in the similar manner. When the determination control portion 24 determines that one or both of the dummy sensors 11a and 11b are touched, the determination control portion 24 does not determine whether the touch sensors 26c to 26h are touched. The determination of whether the touch sensors 26c to 26h are touched is not performed when the variation in the capacitance of one or both of the dummy sensors 11a and 11b exceeds the determination value.

According to this configuration, when the external radio noise generates around, the determination of the operation of the switches 7c to 7h is not performed. Therefore, even when the capacitances of the touch sensors 26c to 26h are changed due to the external radio noise, malfunction does not occur. According to this embodiment, it may be possible to prevent the malfunction caused by the user's unintentional touch and the malfunction caused by the external radio noise.

Second Embodiment

Figure 5:
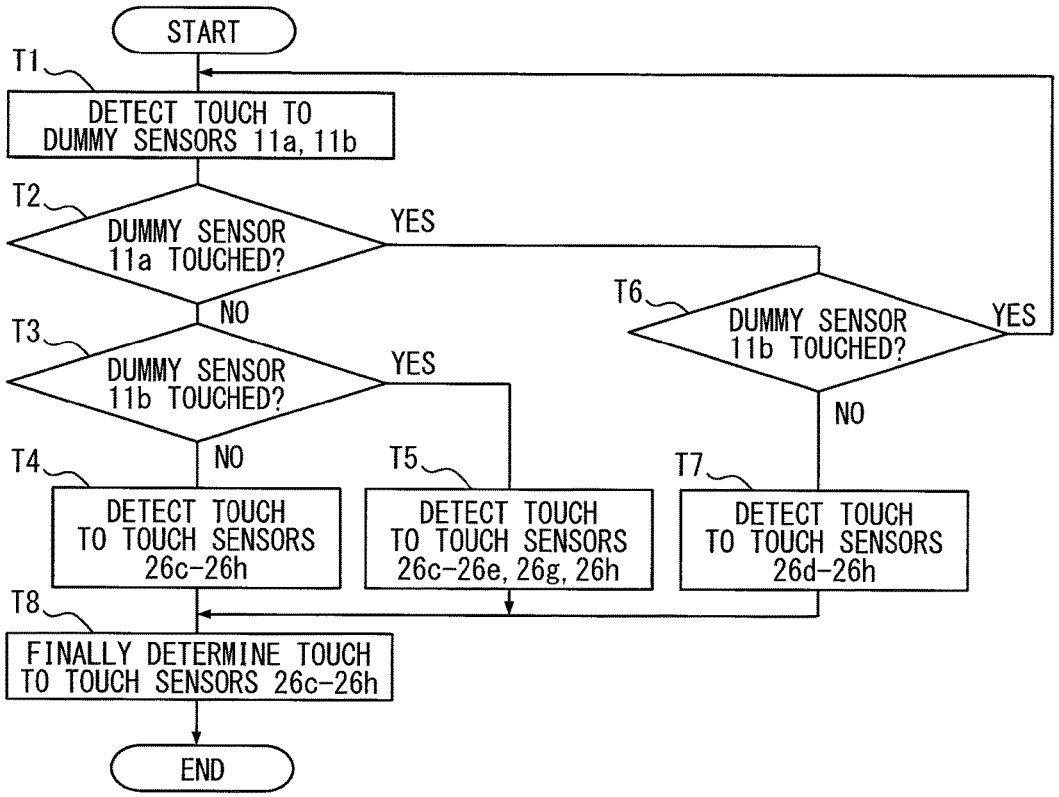
FIG. 5 is a flowchart illustrating the content of processing by a touch detection apparatus according to a second embodiment.

In the first embodiment, when it is determined that at least one of the dummy sensors 11a and 11b is touched, the determination of whether all of the touch sensors 26c to 26h are touched is disabled. The above process has an advantage that the process can be simplified. The first embodiment may not cope with a rare case that "a touch switch other than the switch 7c is operated while the operation knob 7a is operated" or "a touch switch other than the switch 7f is operated while the operation knob 7b is operated". A second embodiment in which the operation of detecting that the touch sensor is touched is so changed as to cope with such a case will be described with reference to FIG. 5.

The determination control portion 24 commands the touch detection portion 23 to execute a process of determining whether the dummy sensors 11a and 11b are touched (Step T1). The determination control portion 24 determines whether the dummy sensor 11a is touched, based on operation detection information supplied from the touch detection portion 23 (Step T2). In this situation, when it is determined that the dummy sensor 11a is not touched (NO in T2), the operation proceeds to Step T3.

The operation proceeds to Step T3, and the determination control portion 24 determines whether the dummy sensor 11b is touched, based on the operation detection information. In this situation, when it is determined that the dummy sensor 11b is not touched (NO in T3), that is, when it is determined that none of the dummy sensors 11a and 11b is touched, the operation proceeds to Step T4. In Step T4, the determination control portion 24 commands the touch detection portion 23 to execute a process of determining whether the touch sensors 26c to 26h are touched.

When it is determined in Step T3 that the dummy sensor 11b is touched (YES), the operation proceeds to Step T5. In Step T5, the determination control portion 24 commands the touch detection portion 23 to execute a process of determining whether the touch sensors 26c to 26e, 26g, and 26h are touched.

When it is determined in Step T2 that the dummy sensor 11a is touched (YES in T2), the operation proceeds to Step T6. In Step T6, like Step T3, it is determined whether the dummy sensor 11b is touched. In this situation, when it is determined that the dummy sensor 11b is touched (YES), that is, when it is determined that both of the dummy sensors 11a and 11b are touched, the operation returns to Step T1.

When it is determined in Step T6 that the dummy sensor 11b is not touched (NO), the operation proceeds to Step T7. In Step T7, the determination control portion 24 commands the touch detection portion 23 to execute a process of determining whether the touch sensors 26d to 26h are touched. After the execution of Step T4, T5 or T7, the operation proceeds to Step T8. The operation proceeds to Step T8, and the determination control portion 24 finally determines whether the touch sensors 26c to 26h are touched, based on the operation detection information supplied from the touch detection portion 23.

As described above, the determination control portion 24 according to this embodiment determines whether the two dummy sensors 11a and 11b are touched, individually. When the determination control portion 24 determines that the dummy sensor 11a is touched, and the dummy sensor 11b is not touched, the determination control portion 24 does not determine (disables the determination of) whether the touch sensor 26c disposed close to the dummy sensor 11a is touched. For that reason, when the operation knob 7a close to the switch 7c is operated, the malfunction caused by the user's unintentional touch is prevented from occurring as in the first embodiment. Moreover, since the determination of whether the touch sensors 26d to 26h are touched is performed, it may be possible to cope with a case in which "the touch switch other than the switch 7c is operated while the operation knob 7a is operated".

When the determination control portion 24 determines that the dummy sensor 11a is not touched, and the dummy sensor 11b is touched, the determination control portion 24 does not determine (disables the determination of) whether the touch sensor 26c disposed close to the dummy sensor 11b is touched. When the operation knob 7b close to the switch 7f is operated, the malfunction caused by the user's unintentional touch is prevented from occurring as in the first embodiment. Moreover, since the determination of whether the touch sensors 26c to 26e, 26g, and 26h are touched is performed, it may be possible to deal with a case in which "the touch switch other than the switch 7f is operated while the operation knob 7b is operated".

When the determination control portion 24 according to the present embodiment determines that both of the dummy sensors 11a and 11b are touched, the determination control portion 24 does not determine whether the touch sensors 26c to 26h are touched. Thus, the occurrence of malfunction caused by the external radio noise is also prevented as in the first embodiment. Therefore, according to the present embodiment, the same advantages as those in the first embodiment are obtained, and the excellent advantage to cope with various operating methods by the user is obtained.

Third Embodiment

In the above respective embodiments, the determination value for determining whether each of the touch sensors 26c to 26h, and the dummy sensors 11a, 11b is touched is the same fixed value. In other words, in the above respective embodiments, the touch on the touch sensors 26c to 26h, and the dummy sensors 11a, 11b is detected with the same detection sensitivity. However, the touch on the touch sensors 26c to 26h, and the dummy sensors 11a, 11b may be modified to be detected with detection sensitivities different from each other. As an example of the above modification, it is proposed that the detection sensitivity of the dummy sensors 11a and 11b is dynamically changed with respect to the detection sensitivity of the touch sensors 26c to 26h depending on various conditions. A description will be given of a third embodiment in which the above respective embodiments are modified as described above.

First Example Changing Detection Sensitivity of Dummy Sensors According to Vehicle Travel State When a vehicle to which a vehicle navigation apparatus 1 is mounted travels, a user's hand may be uncertain due to vibration attributable to the travel. Thus, malfunction caused by an unintentional touch of a user's finger may easily occur during the travel of the vehicle. In this case, the determination value of the dummy sensors 11a and 11b is set to a usual value (a value in a usual situation) when the vehicle is during stop, and set to a value lower than the usual value when the vehicle is traveling. When the vehicle is traveling, the detection sensitivity of the dummy sensors 11a and 11b is set to be high (weighted) with respect to the detection sensitivity of the touch sensors 26c to 26h.

The usual determination value of the dummy sensors 11a and 11b is a variation in the capacitance of the dummy sensor 11a or 11b when the vehicle is in stop, and the user's finger touches (or comes close to) the operation knob 7a or 7b.

According to this configuration, not only when the user's finger completely touches the operation knobs 7a and 7b, but also when the user's finger is slightly separated from the operation knobs 7a and 7b, it may be possible to easily determined that the dummy sensors 11a and 11b are touched. Thus, even when the user's hand is uncertain due to vibration attributable to the travel of the vehicle when the user operates the operation knob 7a or 7b, it may be possible to surely prevent the occurrence of malfunction that it is unintentionally determined that the switch 7c or 7f disposed to the vicinity of the operation knob 7a or 7b is operated.

Second Example Changing Detection Sensitivity of Dummy Sensors According to Vehicle Travel State When a function which is unusable (disabled) during travel, such as a function of destination setting or a function of switching audio sources, is allocated to the operation knobs 7a and 7b, the operation knobs 7a and 7b are not operated during travel of the vehicle. In such a case, the function of the dummy sensors 11a and 11b disposed to the operation knobs 7a and 7b (a function of preventing malfunction occurring when the user's finger unintentionally touches the switches 7c and 7f) may be disabled.

Therefore, for example, when a function that is not operated during travel is allocated to the operation knob 7a, the determination value of the dummy sensor 11a corresponding to the operation knob 7a is set to a value (a value greater than a maximum value of a variation in a usually considered capacitance) higher than a usual value. Thus, when the vehicle is traveling, the detection sensitivity of the dummy sensor corresponding to the operation portion to which the function unusable during travel is allocated is set to be low (weighted) with respect to the detection sensitivity of the touch sensors 26c to 26h. According to the present configuration, when the switch 7c is operated, even when the user's finger erroneously touches the operation knob 7a located in the vicinity of the switch 7c, the determination of whether the switch 7c is touched is not disabled.

Example Changing Detection Sensitivity of Dummy Sensors According to Last Operation When a relevance between the function allocated to the operation knobs 7a and 7b and the function (operation) executed previously is high, the possibility that the user thereafter operates the operation knobs 7a and 7b is high. When the function allocated to the operation knobs 7a and 7b and the function executed previously have a low relevance or no relevance, the possibility that the user thereafter operates the operation knobs 7a and 7b is low.

Focusing on the above fact, the detection sensitivity of the dummy sensors may be changed in the following manners (a) and (b) on the basis of the relevance of the function allocated to the operation knobs 7a and 7b and the function executed previously. In this example, a description will be given of a case in which a sound volume adjustment function of an audio is allocated to the operation knob 7b, and a current position display return function (current position switch) is allocated to the switch 7f located in the vicinity of the operation knob 7b.

(a) A Case where the Last Operation Relates to Audio Screen

An audio screen is designed to select a sound source (source) such as a radio, a CD. In general, sound volumes when reproducing the audio are frequently different from each other due to a sound source. Therefore, when the audio screen is displayed on the display portion 8 by performing operation for the audio screen previously, the possibility that the user thereafter operates the operation knob 7b is high. The operation knob 7b has, for example, the sound volume adjustment function. In this case, the possibility that the user operates the switch 7f is low. The switch 7f has, for example, the current position return function.

Therefore, in this case, the determination value of the dummy sensor 11b corresponding to the operation knob 7b is set to a value lower than a usual value. When the function allocated to the operation knob 7b and the function executed previously have a high relevance, the detection sensitivity of the dummy sensor 11b is set to be high. According to this setting, it may be likely to determine that the dummy sensor 11b is touched. Thus, when the operation knob 7b highly likely to be operated is operated, it may be possible to surely prevent the occurrence of malfunction that it is unintentionally detected that the switch 7f, which is unlikely to be operated, is operated.

(b) A Case where Previous Operation Relates to Map

When a map screen (particularly, scrolled map screen) is displayed on the display portion 8 by performing operation for the map previously, the possibility that the user thereafter operates the switch 7f (current position return function is used) is high. In this case, the possibility that the user operates the operation knob 7b (volume adjustment function is used) is low.

Therefore, the determination value of the dummy sensor 11b corresponding to the operation knob 7b is set to a value higher than a usual value. When the function allocated to the operation knob 7b and the function executed previously have a low relevance, the detection sensitivity of the dummy sensor 11b is set to be low. According to this setting, it may be likely to determined that the dummy sensor 11b is not touched. Thus, when the switch 7f highly likely to be operated is operated, even when the user's finger erroneously touches the operation knob 7b unlikely to be operated, the determination of whether the switch 7f is touched is not disabled.

As described above, according to the present embodiment, the detection sensitivity of the dummy sensors 11a and 11b is dynamically changed with respect to the detection sensitivity of the touch sensors 26c to 26h depending on various conditions. As a result, the following advantage is obtained. It may be possible to prevent the malfunction (the touch on the operation knobs 7a and 7b leads to malfunction in one situation, but the touch on the switches 7c and 7f leads to malfunction in another situation) dynamically changed depending on the situation from occurring with high precision.

Fourth Embodiment

A fourth embodiment of the present disclosure will be described with reference to FIG. 6 to FIG. 8.

Figure 6:
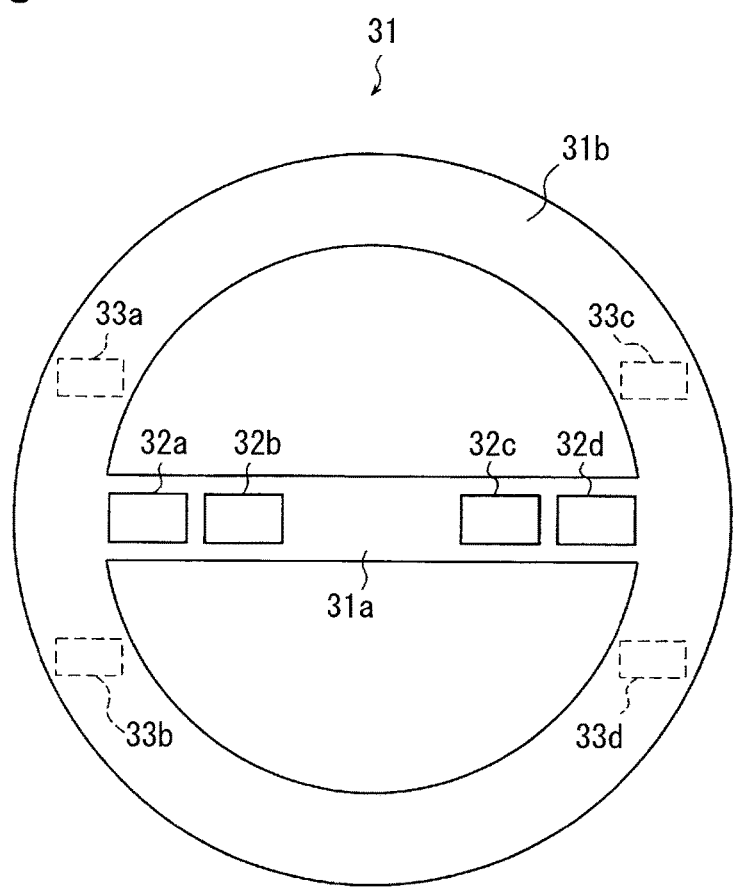
FIG. 6 is an external front view of a steering wheel according to a fourth embodiment.

A steering wheel 31 (corresponding to an operation portion) illustrated in FIG. 6 is disposed in a vehicle such as an automobile. A surface (a surface on a driver side) of a spoke part 31a of the steering wheel 31 is provided with steering switches 32a to 32d to which various functions (a temperature adjustment function of an air conditioner, a sound volume adjustment function of the audio, and so on) are assigned. The steering switches 32a to 32d are each formed of a configuration using a capacitive touch sensor, that is, a touch switch.

A rear surface (a surface opposite to the driver) of a grip part 31b of the steering wheel 31 is provided with dummy sensors 33a to 33d. The dummy sensors 33a to 33d are each formed of a capacitive touch sensor. The dummy sensors 33a to 33d are arranged at places to perform a capacitive coupling with the user's finger when the user grips the grip part 31*b* for operating the steering wheel 31.

The positions of the dummy sensors 33*a* to 33*d* may be appropriately changed as long as those positions do not overlap with those of the steering switches 32*a* to 32*d* and the dummy sensors 33*a* to 33*d* are each positioned to perform the capacitive coupling with the user's finger when the user grips the steering wheel 31. The dummy sensors 33*a* to 33*d* are not intended to perform a predetermined operation, but intended to prevent the malfunction of the steering switches 32*a* to 32*d*.

Figure 7:
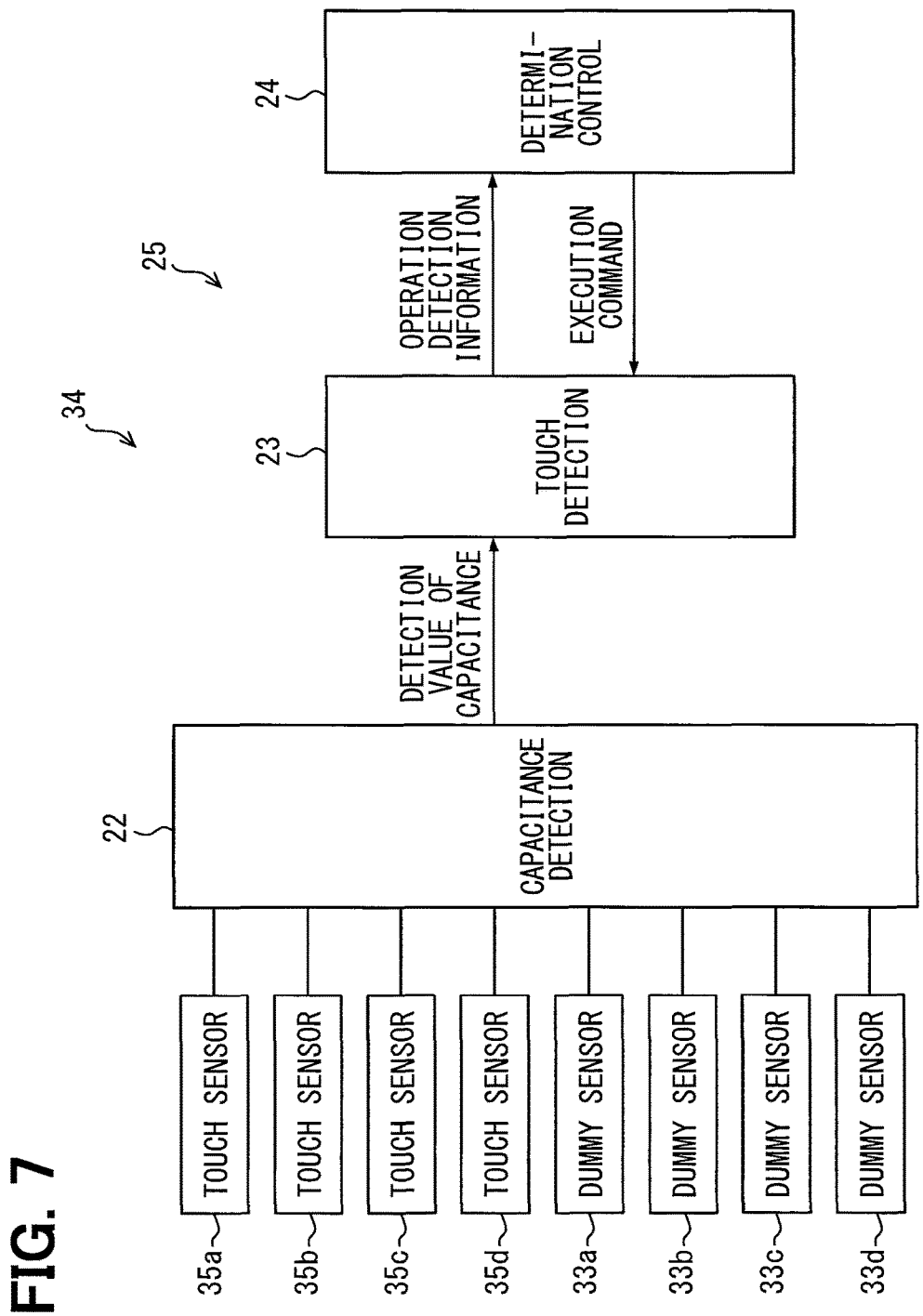
FIG. 7 is a bock diagram illustrating a schematic configuration of a touch detection apparatus according to the fourth embodiment.
Figure 8:
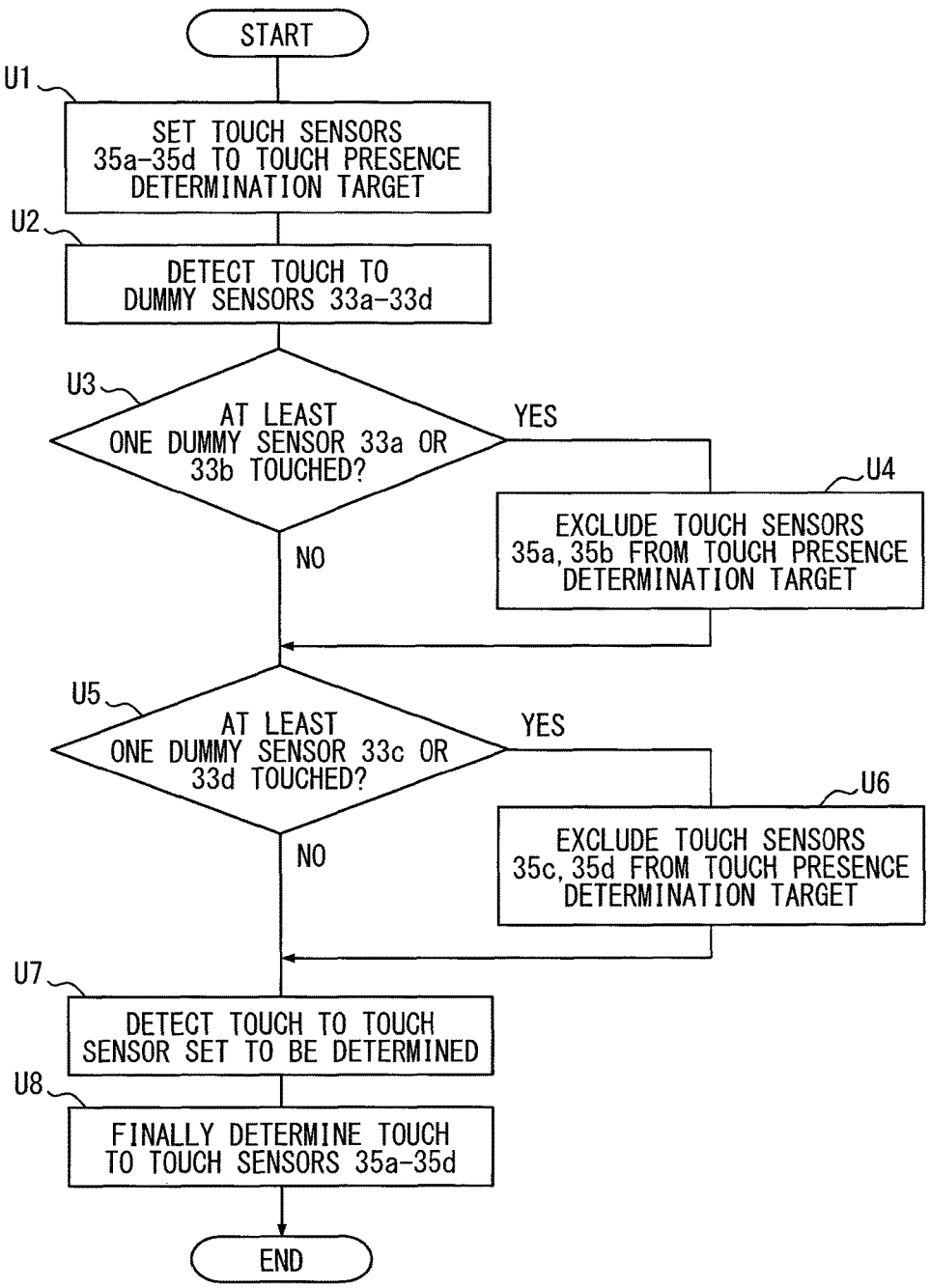
FIG. 8 is a flowchart illustrating the content of processing by the touch detection apparatus according to the fourth embodiment.

The touch operation on the steering switches 32*a* to 32*d* and the dummy sensors 33*a* to 33*d*, that is, a touch on the touch sensors is detected by a touch detection apparatus 34 illustrated in FIG. 7. The touch detection apparatus 34 has an identical configuration with that of the touch detection apparatus 21 illustrated in FIG. 3. The capacitance detector 22 detects values of capacitances of touch sensors 35*a* to 35*d* corresponding to the respective steering switches 32*a* to 32*d*, and values of the capacitances of the dummy sensors 33*a* to 33*d*.

The operation of detecting that the steering sensors 32*a* to 32*d* are touched by the touch detection apparatus 34 will be described with reference to a flowchart of FIG. 8.

The determination control portion 24 sets all of the touch sensors 35*a* to 35*d* as touch presence determination targets (Step U1). The determination control portion 24 commands the touch detection portion 23 to execute a process of determining whether the dummy sensors 33*a* to 33*d* are touched (Step U2). The determination control portion 24 determines whether the dummy sensors 33*a* and 33*b* are touched, based on operation detection information supplied from the touch detection portion 23 (Step U3).

When it is determined that at least one of the dummy sensors 33*a* and 33*b* is touched (YES in U3), the operation proceeds to Step U4. In Step U4, the touch sensors 35*a* and 35*b* arranged on the same side (a left side toward a vehicle front) as that of the dummy sensors 33*a* and 33*b* are excluded from the touch presence determination targets. After the execution of Step U4, the operation proceeds to Step U5. When it is determined that none of the dummy sensors 33*a* and 33*b* is touched (NO in U3), the operation proceeds to Step U5.

In Step U5, the determination control portion 24 determines whether the dummy sensors 33*c* and 33*d* are touched, based on operation detection information supplied from the touch detection portion 23. When it is determined that at least one of the dummy sensors 33*c* and 33*d* is touched (YES in U5), the operation proceeds to Step U6. In Step U6, the touch sensors 35*c* and 35*d* arranged on the same side (a right side toward the vehicle front) as that of the dummy sensors 33*c* and 33*d* are excluded from the touch presence determination targets. After the execution of Step U6, the operation proceeds to Step U7.

When it is determined that none of the dummy sensors 33*c* and 33*d* is touched (NO in U5), the operation proceeds to Step U7. In Step U7, the determination control portion 24 commands the touch detection portion 23 to execute a process of determining whether the sensors set as the determination targets in the touch sensors 35*a* to 35*d* are touched. The determination control portion 24 finally determines whether the touch sensors 35*a* to 35*d* are touched, based on the operation detection information supplied from the touch detection portion 23 (Step U8).

As described above, in this embodiment, it is determined whether the dummy sensors 33*a* and 33*b* are touched. When it is determined that the dummy sensors 33*a* and 33*b* arranged on the left side of the grip part 31*b* are touched, it is not determined whether the touch sensors 35*a* and 35*b* arranged on the left side of the spoke part 31*a* are touched (disabled). When it is determined that the dummy sensors 33*c* and 33*d* arranged on the right side of the grip part 31*b* are touched, it is not determined whether the touch sensors 35*c* and 35*d* arranged on the right side of the spoke part 31*a* are touched. Thus, when the steering wheel 31 is operated, it may be possible to prevent the malfunction caused by the user's unintentional touch from occurring as follows.

When the user grasps a left side of the grip part 31*b* of the steering wheel 31, the capacitive couplings are performed between at least parts of the user's left hand, and the dummy sensors 33*a* and 33*b*, and the capacitances of the dummy sensors 33*a* and 33*b* are changed. When a variation in the capacitance of the dummy sensors 33*a* and 33*b* exceeds a determination value, it is not determined whether the touch sensors 35*a* and 35*b* are touched. Thus, while the user grasps the left side of the grip part 31*b* of the steering wheel 31, it is not determined whether the steering switches 32*a* and 32*b* are operated. Therefore, when the user operates the steering wheel 31 while griping the left side of the grip part 31*b* of the steering wheel 31, even when the user's (a left hand) finger (particularly, thumb) erroneously touches the steering switches 32*a* and 32*b*, the unintentional malfunction does not occur.

When the user grasps a right side of the grip part 31*b* of the steering wheel 31, the capacitive couplings are performed between at least parts of the user's right hand, and the dummy sensors 33*c* and 33*d*, and the capacitances of the dummy sensors 33*c* and 33*d* are changed. The determination of whether the touch sensors 35*c* and 35*d* are touched is not performed when the variations in the capacitances of the dummy sensors 33*c* and 33*d* exceed the determination value. For that reason, in a period when the user grasps the right side of the grip part 31*b* of the steering wheel 31, it is not determined whether the steering switches 32*c* and 32*d* are operated. Therefore, when the user operates the steering wheel 31 while griping the right side of the grip part 31*b* of the steering wheel 31, even when the user's (a right hand) finger (particularly, thumb) erroneously touches the steering switches 32*c* and 32*d*, the unintentional malfunction does not occur.

According to the present configuration, it may be possible to prevent the malfunction caused by the external radio noise from occurring as follows. When the external radio noise generates, the capacitances of the touch sensors 35*a* to 35*d* and the dummy sensors 33*a* to 33*d* are changed in the similar manner. In the present embodiment, when it is determined that all of the dummy sensors 33*a* to 33*d* are touched, the determination of whether all of the touch sensors 35*a* to 35*d* are touched is not performed. The determination of whether all of the touch sensors 35*a* to 35*d* are touched is not implemented when the variations in the capacitances of all the dummy sensors 33*a* to 33*d* exceed the determination value.

According to this configuration, when the external radio noise is generated around, the determination of the operation of the steering switches 32*a* to 32*d* is not performed. Therefore, even when the capacitances of the touch sensors 35*a* to 35*d* are changed due to the external radio noise, malfunction does not occur. As described above, according to this embodiment, it may be possible to prevent both of the malfunction caused by the user's unintentional touch and the malfunction caused by the external radio noise.

Other Embodiments

The present disclosure is not limited to the respective embodiments described above and illustrated in the drawings, but can be modified or expanded as follows.

The touch panel 7i of the vehicle navigation apparatus 1 may use a capacitive touch switch (a touch sensor). In this case, the touch switch of the touch panel 7i may be treated in the similar manner as that of the touch switches (7c, 7f), which present close to the operation knobs 7a and 7b, and may be applied with the same process as that in the first to third embodiments.

The switches 7c to 7h are not limited to the configuration in which one touch sensor is provided for each switch, but may be configured so that multiple touch sensors are provided for each switch.

The present disclosure is not limited to a configuration in which predetermined fixed functions are allocated to the operation knobs 7a, 7b, the switches 7c to 7h, and the steering switches 32a to 32d, but the allocated functions may be arbitrarily switched to others. In this case, the detection sensitivity of the dummy sensors may be changed according to the allocated function.

The touch detection apparatuses 21 and 34 are not limited to the intended purpose (for vehicle) described in the above respective embodiments, but may be used for the general intended purposes for detecting a touch on the capacitive touch sensors. In the case of a layout in which the operating units (a structural operation portion, a mechanical switch, an electric switch, or the like) operated by the user, and the dummy sensors are arranged in the vicinity of the touch sensors to be detected, it may be possible to prevent the malfunction caused by the user's unintentional touch from occurring effectively. The "vicinity" described in the present specification represents a distance between the touch sensor and the dummy sensor which may be touched by the user at the same time. The "vicinity" means a distance to the extent that with a touch (contact or proximity) on one of the touch sensor and the dummy sensor, the other sensor may also perform the capacitive coupling with the user's finger.

The touch detection operation (the flowchart in FIG. 4) according to the first embodiment can be applied to both of a case in which only one operation portion and one dummy sensor described above are present, and a case in which multiple operating units and multiple dummy sensors are present. The touch detection operation (the flowchart in FIG. 5) in the second embodiment can be applied to not only a case in which two of the operating units (and dummy sensors) described above are present, but also a case in which three or more operating units (and dummy sensors) are present.

The touch detection apparatus according to one aspect of the present disclosure detects the touch on the capacitive touch sensor operated by the user's touch in the following manner. In other words, when the user's finger touches the touch sensor, a value of the capacitance of the touch sensor is changed. The touch determination portion detects a change in such a capacitance on the basis of the detection value of the capacitance detector for detecting the value of the capacitance of the touch sensor, and determines whether the touch sensor is touched, based on the detected change.

In this case, the operation portion operated by the user is disposed in the vicinity of the touch sensor. In the case of this layout, when the user attempts to operate the operation portion, the possibility that the user's finger erroneously touches the touch sensor is relatively high. Thus, the user's unintentional malfunction may occur. The present disclosure prevents the above malfunction from occurring in the following manner.

The capacitive dummy sensor is disposed to the operation portion. The capacitance detector also detects the value of the capacitance of the dummy sensor. The touch determination portion disables the determination of whether the touch sensor is touched when the touch determination portion detects that the variation in the capacitance of the dummy sensor exceeds the predetermined determination value on the basis of the detection value of the capacitance detector.

According to the above configuration, when the user's finger touches (or comes close to) the operation portion for operating the operation portion, the capacitance of the dummy sensor is changed. When the variation in the capacitance of the dummy sensor exceeds the determination value, the touch determination portion disables the determination on the touch sensor by the touch determination portion. According to this configuration, the determination of whether the touch sensor is touched is not performed during a period of time when the user operates the operation portion. Therefore, even when the user's finger erroneously touches the touch sensor, it may be possible to prevent the occurrence of malfunction.

According to the above configuration, it may be possible to prevent the occurrence of malfunction caused by the external radio noise as follows. That is, when the external radio noise is generated, the capacitances of the touch sensor and the dummy sensor are changed in the similar manner. The touch determination portion disables the determination of whether the touch sensor is touched when the variation in the capacitance of the dummy sensor exceeds the determination value. According to this configuration, when the external radio noise is generated around, the determination of whether the touch sensor is touched is not performed. Therefore, even when the capacitance of the touch sensor is changed by the external radio noise, it may be possible to prevent the occurrence of malfunction. As described above, according to the present disclosure, it may be possible to prevent both of the malfunction caused by the user's unintentional touch and the malfunction caused by the external radio noise.

While the embodiments, the configurations, and the modes of the touch detection apparatus and the vehicle navigation apparatus according to the present disclosure are illustrated above, embodiments, configurations, and modes according to the present disclosure are not limited to the respective embodiments, the respective configurations, and the respective modes described above. For example, an embodiment, a configuration, and an aspect which are obtained by appropriately combining technical portions disclosed in different embodiments, configurations, and aspects are also included in the embodiments, the configurations, and the aspects according to the present disclosure.

What is claimed is:

1. A touch detection apparatus that detects a touch by a user, comprising:
    a capacitive touch sensor that receives the touch from the user;
    an operation knob disposed in a vicinity of the capacitive touch sensor and configured to receive both rotating operation and depressing operation by the user;
    a capacitive dummy sensor on the operation knob;
    a capacitance detector that detects values of capacitances of the capacitive touch sensor and the capacitive dummy sensor; and a controller that is configured to determine whether the capacitive touch sensor is touched, based on detection values of the capacitance detector and that disables determination of whether the capacitive touch sensor is touched when a variation in capacitance of the capacitive dummy sensor exceeds a predetermined threshold,
wherein:
a plurality of dummy sensors and a plurality of capacitive touch sensors are disposed, a particular dummy sensor of the dummy sensors being disposed in a vicinity of and corresponding to a particular touch sensor of the plurality of capacitive touch sensors; and
when the variation in capacitance of the particular dummy sensor of the dummy sensors exceeds the predetermined threshold,
the controller disables the determination of whether the particular touch sensor of the plurality of capacitive touch sensors is touched, and continues the determination of whether another capacitive touch sensors other than the particular touch sensor of the plurality of capacitive touch sensors is touched.

2. The touch detection apparatus according to claim 1, wherein:
when the variation in each capacitance of the plurality of dummy sensors exceeds the predetermined threshold, the controller disables all determinations of whether the capacitive touch sensors are touched.

3. A touch detection apparatus that detects a touch by a user, comprising:
a capacitive touch sensor that receives the touch from the user;
an operation knob that is disposed in a vicinity of the capacitive touch sensor and configured to receive both rotating operation and depressing operation by the user;
a capacitive dummy sensor on the operation knob;
a capacitance detector that detects values of capacitances of the capacitive touch sensor and the capacitive dummy sensor; and
a controller configured to determine whether the capacitive touch sensor is touched, based on detection values of the capacitance detector and that disables determination of whether the capacitive touch sensor is touched when a variation in capacitance of the capacitive dummy sensor exceeds a predetermined threshold,
wherein:
when a probability that the operation knob is operated is high, the controller sets the predetermined threshold to a value lower than a value in a specific situation; and
when the probability that the operation knob is operated is low, the controller sets the predetermined threshold to a value higher than the value in the specific situation.

4. A touch detection apparatus that detects a touch by a user, comprising:
a capacitive touch sensor that receives the touch from the user;
an operation knob that is disposed in a vicinity of the capacitive touch sensor and configured to receive both rotating operation and depressing operation by the user;
a capacitive dummy sensor on the operation knob;
a capacitance detector that detects values of capacitances of the capacitive touch sensor and the capacitive dummy sensor; and
a controller configured to determine whether the capacitive touch sensor is touched, based on detection values of the capacitance detector and that disables determination of whether the capacitive touch sensor is touched when a variation in capacitance of the capacitive dummy sensor exceeds a predetermined threshold,
wherein:
the capacitive touch sensor and the capacitive dummy sensor are in a vehicle; and
when the vehicle is traveling, the controller sets the predetermined threshold to a value lower than a value in a specific situation.

5. A vehicle navigation apparatus comprising:
the touch detection apparatus according to claim 1; and
a touch switch that includes the capacitive touch sensor;
wherein:
a touch operation to the touch switch is detected by the touch detection apparatus.

6. The touch detection apparatus according to claim 1, wherein:
the vicinity of the capacitive touch sensor represents a distance between the capacitive touch sensor and the operation knob, and both the capacitive touch sensor and the operation knob are touched by the user at a same time when the user operates the operation knob.

7. The touch detection apparatus according to claim 3, wherein:
the specific situation is a case where a vehicle stops; and
the value in the specific situation is a value set in the case where a vehicle stops.

8. The touch detection apparatus according to claim 1, wherein the capacitive dummy sensor is located on the operation knob such that the capacitive dummy sensor performs capacitive coupling with a finger of the user when the finger of the user touches the operation knob.

9. The touch detection apparatus according to claim 3, wherein the capacitive dummy sensor is located on the operation knob such that the capacitive dummy sensor performs capacitive coupling with a finger of the user when the finger of the user touches the operation knob.

10. The touch detection apparatus according to claim 4, wherein the capacitive dummy sensor is located on the operation knob such that the capacitive dummy sensor performs capacitive coupling with a finger of the user when the finger of the user touches the operation knob.

11. The touch detection apparatus according to claim 1, wherein the operation knob is cylindrical with a circular end and a sidewall attached to the circular end and the capacitive dummy sensor is located on the circular end of the operation knob.

12. The touch detection apparatus according to claim 1, wherein the operation knob is cylindrical with a circular end and a sidewall attached to the circular end and the capacitive dummy sensor is located on the cylindrical sidewall of the operation knob.

* * * * *